(12) United States Patent
Chacko et al.

(10) Patent No.: US 7,154,338 B2
(45) Date of Patent: Dec. 26, 2006

(54) POWER CONTROL CIRCUIT AND METHOD

(75) Inventors: V. C. Prakash V K Chacko, Penang (MY); Narendra Kumar Aridas, Kedah (MY); Kiat Hoe Wong, P. Pinang (MY)

(73) Assignee: Motorola, Inc., Schaumburg, IL (US)

( * ) Notice: Subject to any disclaimer, the term of this patent is extended or adjusted under 35 U.S.C. 154(b) by 83 days.

(21) Appl. No.: 11/026,213

(22) Filed: Dec. 30, 2004

(65) Prior Publication Data

US 2006/0145764 A1    Jul. 6, 2006

(51) Int. Cl.
*H03G 3/10* (2006.01)
(52) U.S. Cl. .................... 330/285; 330/129; 330/296
(58) Field of Classification Search ............. 330/285, 330/129, 296
See application file for complete search history.

(56) References Cited

U.S. PATENT DOCUMENTS

| | | | | |
|---|---|---|---|---|
| 5,422,598 A | * | 6/1995 | Maeda et al. | 330/136 |
| 5,559,423 A | * | 9/1996 | Harman | 323/277 |
| 5,818,707 A | * | 10/1998 | Seong et al. | 363/89 |
| 5,959,443 A | * | 9/1999 | Littlefield | 323/287 |
| 6,025,754 A | | 2/2000 | Czora | |
| 6,563,385 B1 | | 5/2003 | Wojslaw | |
| 6,665,525 B1 | * | 12/2003 | Dent et al. | 455/108 |
| 6,734,729 B1 | * | 5/2004 | Andrys et al. | 330/129 |

\* cited by examiner

*Primary Examiner*—Patricia Nguyen
(74) *Attorney, Agent, or Firm*—Valerie M. Davis

(57) ABSTRACT

A method (400) for controlling power and an amplifier and associated power control circuit (100) with a power amplifier (110) coupled through a current sensing resistor (Rsen) to a supply voltage line (vcc). There is also a current to voltage converter (120) having a converter output (135) and at least one converter input, the converter input being coupled to the supply voltage line (Vcc) of the power amplifier (110). A voltage reference providing circuitry (140) is coupled to a second input (152) of an integrator (150) that also has an integrator output (153) and a first input (151) coupled to the converter output (135) and a direct current biasing circuit (195) couples the integrator output ((153) to an amplifier input (111) of amplifier (110). The method (400) and circuit (100) use a time dependent predefined voltage characteristic supplied to the integrator (150).

20 Claims, 4 Drawing Sheets

POWER CONTROL CIRCUIT AND METHOD

FIELD OF THE INVENTION

This invention relates power control circuits for radio frequency power amplifiers and a method for controlling power provided at an output of power amplifiers.

BACKGROUND ART

In general, radio frequency power control circuits for radio frequency power amplifiers are designed to switch rapidly from an un-biased (non-amplifying) state to a biased (amplifying). During this switching it is a requirement of the European Telecommunications Standards (ETS) specification that splatter must not occur. Splatter is essentially a power spectral re-growth that spills over to an adjacent channel frequency.

Typically, to avoid splatter, conventional radio frequency power amplifier control circuits typically employ a directional coupler, attenuator and a log amplifier biasing the power amplifier. There are significant size and cost overheads for the design and use of the directional coupler at the lower frequency VHF band. Furthermore, adjustment of the attenuator is necessary in order to fit the log amplifier operation into a log conformance's region as will be apparent to a person skilled in the art. Accordingly, the log amplifier limits the dynamic range of the power amplifier and adjacent power channel ramping cannot be switched abruptly or splatter will occur. Consequently, conventional radio frequency power amplifier control circuits employ a holding voltage of about 500 µSeconds that slows down the switching of the power amplifier from an un-biased (non-amplifying) state to a biased (amplifying).

In this specification, including the claims, the terms 'comprises', 'comprising' or similar terms are intended to mean a non-exclusive inclusion, such that a method or apparatus that comprises a list of elements does not include those elements solely, but may well include other elements not listed.

SUMMARY OF THE INVENTION

According to one aspect of the invention there is provided an amplifier and associated power control circuit comprising:

a power amplifier coupled through a current sensing resistor to a supply voltage line, the power amplifier having an amplifier input and an amplifier output;

a current to voltage converter having a converter output and at least one converter input, the converter input being coupled to the supply voltage line of the power amplifier;

a voltage reference providing circuitry having a voltage reference output;

an integrator having an integrator output, a first input coupled to the converter output and a second input coupled to the voltage reference output; and a direct current biasing circuit coupling the integrator output to the amplifier input.

Suitably, in use, a potential difference occurring between the first input and second input is integrated by the integrator to provide an integrated voltage difference output control signal at the integrator output, wherein the output control signal controls power supplied to the power amplifier by the supply voltage line.

In use, the output control signal provides for biasing the power amplifier from a substantially non-amplifying state to a desired amplifying state. Suitably, in use, the voltage reference providing circuitry may provide a time dependent pre-defined voltage characteristic during a transition of the power amplifier from the non-amplifying state to the amplifying state.

The time dependent pre-defined voltage characteristic may be characterized by having only a single steady state condition during the transition of the power amplifier. The time dependent pre-defined voltage characteristic may be characterized by comprising a discrete non linear transition followed by the single steady state condition. Suitably, the transition is substantially sinusoidal. In an alternative, the transition is substantially Gaussian Suitably there is an oscillator coupled to the amplifier input.

There may be a trigger circuit for controlling power supplied to the integrator. The trigger circuit suitably, in use, provides a control signal for activation of the voltage reference providing circuitry. The trigger circuit may suitably control power supplied to the current to voltage converter to effect the transition of the power amplifier. Also, the trigger circuit may suitably control power supplied to the power amplifier.

According to another aspect of the invention, there is provided a method for controlling power provided at an output of the power amplifier, the method including:

Providing a voltage reference in response to a transmit request control signal;

Integrating a voltage difference between the voltage reference and a voltage detection value, the voltage detection value being dependent upon the power provided at an output of the power amplifier, the integrating providing an integrated voltage difference output control signal;

Biasing the power amplifier with a direct current bias voltage the value of which is dependent on the integrated voltage difference output control signal;

Amplifying a radio frequency signal supplied at an input to the power amplifier, the amplifying being dependent on a value the direct current bias voltage;

Sensing current drawn by the power amplifier to provide a sensed current signal; and Converting the sensed current signal into the voltage detection value, the voltage detection value varying in response to variations in the sensed current signal.

Suitably, the direct current bias voltage controls power supplied to the power amplifier by the supply voltage line.

In use, the direct current bias voltage provides for biasing the power amplifier from a substantially non-amplifying state to a desired amplifying state. Suitably, the voltage reference is a time dependent pre-defined voltage characteristic during a transition of the power amplifier from the non-amplifying state to the amplifying state.

The time dependent pre-defined voltage characteristic may be characterized by having only a single steady state condition during the transition of the power amplifier. The time dependent pre-defined voltage characteristic may also be characterized by being devoid of a steady state holding voltage during the transition of the power amplifier. The time dependent pre-defined voltage characteristic may be characterized by comprising a discrete non linear transition followed by the single steady state condition. Suitably, the transition is substantially sinusoidal. In an alternative, the transition is substantially Gaussian

BRIEF DESCRIPTION OF THE DRAWINGS

In order that the present invention may be readily understood and put into practical affect, reference will now be made to an exemplary embodiment illustrated in the accompanying drawings in which.

DETAILED DESCRIPTION OF THE INVENTION

The instant disclosure is provided to further explain in an enabling fashion the best modes of making and using one or more embodiments in accordance with the present invention. The disclosure is further offered to enhance an understanding and appreciation for the inventive principles and advantages thereof, rather than to limit in any manner the invention. It is further understood that the use of relational terms are used solely to distinguish one from another entity or action without necessarily requiring or implying any actual such relationship or order between such entities or actions.

Much of the inventive functionality and many of the inventive principles are best implemented with or in software programs or instructions and integrated circuits (ICs) such as application specific ICs. It is expected that one of ordinary skill when guided by the concepts and principles disclosed herein will be readily capable of generating such software instructions and programs and ICs with minimal experimentation. Therefore, in the interest of brevity and minimization of any risk of obscuring the principles and concepts according to the present invention, further discussion of such software and ICs will be limited to the essentials with respect to the principles and concepts used?£

Figure 1:
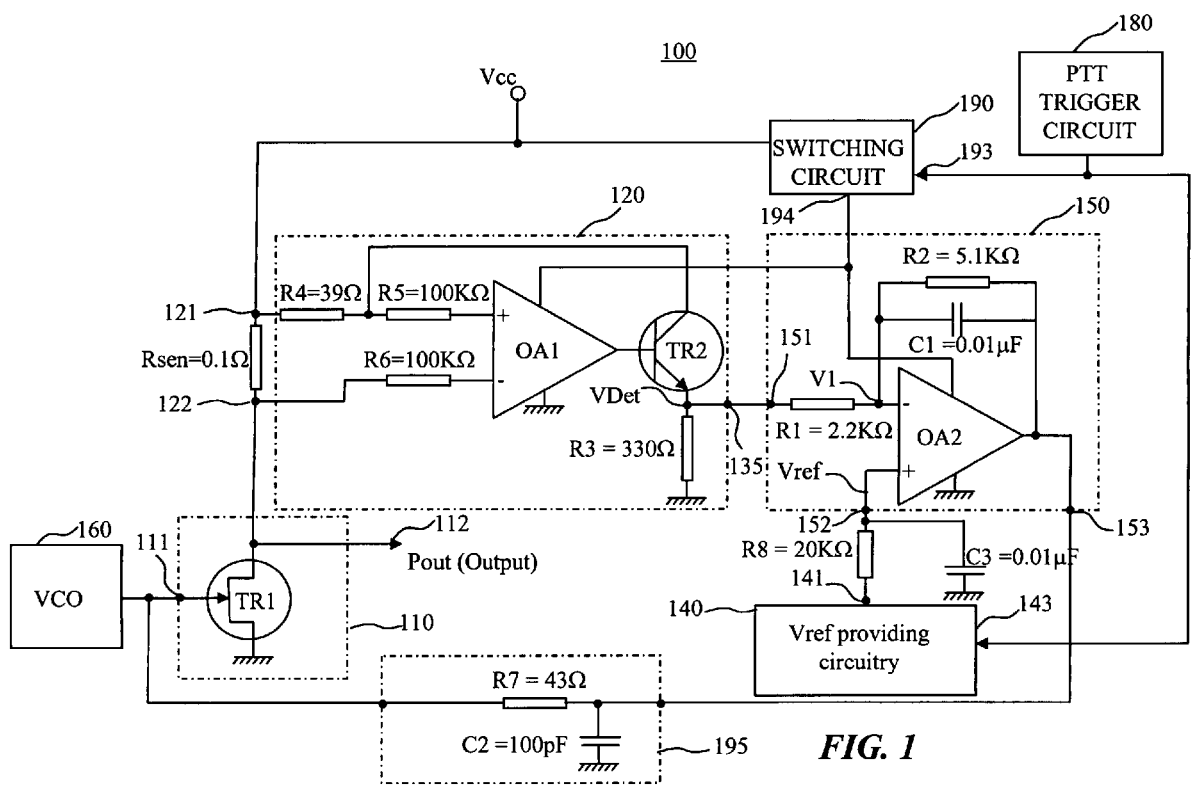
FIG. 1 is an embodiment of amplifier and associated power control circuit in accordance with the present invention.

Referring to FIG. 1 there is illustrated a power amplifier and associated power control circuit 100 comprising a power amplifier 110 coupled through a current sensing resistor Rsen to a supply voltage line Vcc, the power amplifier 110 having an amplifier input 111 and an amplifier output 112. The power amplifier and associated power control circuit 100 typically form part of a radio communications device such as, but not limited to, a two way radio. The power amplifier 110 in this exemplary embodiment is a Field Effect Transistor TR1 with a gate electrode forming the amplifier input 111, a drain electrode that is coupled to the current sensing resistor Rsen and provides the amplifier output 112 and a source electrode coupled to ground.

The circuit 100 also has a current to voltage converter 120 having a converter output 135 and converter inputs 121,122, the converter inputs 121,122, being coupled to the supply voltage line Vcc of the power amplifier 100. In this regard the converter inputs 121,122 are at different potential when current flows through Field Effect Transistor TR1 since the converter inputs 121,122 are coupled to opposite sides of the current sensing resistor Rsen. More specifically, the input 122 is directly coupled to the drain electrode of Field Effect Transistor TR1 and input 121 is directly coupled to supply voltage line Vcc. The converter 120 includes a series coupled combination of a resistors R4 and R5, where the resistor R5 is directly coupled to a non-inverting input of an Operational amplifier1 OA1 and resistor R4 is directly coupled to input 121. Also, there is a resistor R6 coupling input 122 to an inverting input of the Operational amplifier OA1.

The converter 120 also has a bipolar transistor TR2 with a base electrode coupled to an output of the Operational amplifier OA1, a collector electrode coupled to a common node of the series coupled combination of a resistors R4 and R5. Further, an emitter electrode of the bipolar transistor TR2 is coupled directly to the converter output 135 and the emitter electrode is also coupled to ground by a resistor R3.

The circuit 100 has voltage reference providing circuitry 140 having a voltage reference output 141, the voltage reference providing circuitry 140 is essentially a programmed controller that provides a time dependent pre-defined voltage characteristic described later herein. The circuit 100 also has an integrator 150 having an integrator output 153, a first input 151 coupled to the converter output 135 and a second input 152 coupled to the voltage reference output 141 through a resistor R8. The resistor R8 has an associated capacitor C3 forming an RC smoothing circuit, wherein the capacitor C3 has one electrode coupled to the second input 152 and the other electrode coupled to ground. The integrator 150 includes resistor R1 coupling the first input 151 to an inverting input of an operational amplifier2 OA2. A non-inverting input of the operational amplifier2 OA2 is coupled to the second input 152 and a parallel coupled resistor capacitor network of a capacitor C1 and resistor R2 provides a feedback from the integrator output 153 to the inverting input of operational amplifier OA2.

The circuit 100 has a direct current biasing circuit 195 coupling the integrator output 153 to the amplifier input 111. The direct current biasing circuit 195 includes a resistor R7 coupling the integrator output 153 to the amplifier input 111. The direct current biasing circuit 195 further includes and a radio frequency grounding capacitor C2 with one capacitor electrode coupled between the resistor R7 and the integrator output 153 and another capacitor electrode is directly coupled to ground.

There is also Voltage Controlled Oscillator (VCO) 160 coupled to the amplifier input 111 and a Push To Talk (PTT) trigger circuit 180 has an output coupled to both a control input 193 of a switching circuit 190 and a control input 143 of the voltage reference providing circuitry 140. The switching circuit 190 is coupled to the power supply (supply voltage) Vcc and has a power supply output coupled to both a power supply input of Operational Amplifier1 OA1 and a power supply input of Operational Amplifier2 OA2. The trigger circuit 180 provides for controlling power supplied to both the integrator 150, current to voltage converter 120 and power amplifier 110 by providing a transmit request control signal to control input 193. As a result, the switching circuit 190, controlled by signals provided at input 193, supplies power to Operational Amplifier1 OA1 and Operational Amplifier2 OA2 and the drain electrode of Field Effect Transistor TR1.

The trigger circuit further 180 provides for controlling or activating of the voltage reference providing circuitry 140 by providing the transmit request control signal to control input 143. Thus, as will be apparent to a person skilled in the art, the trigger circuit 180 instigates a transition of the power amplifier 110 from a non-amplifying state to an amplifying state.

Figure 2:
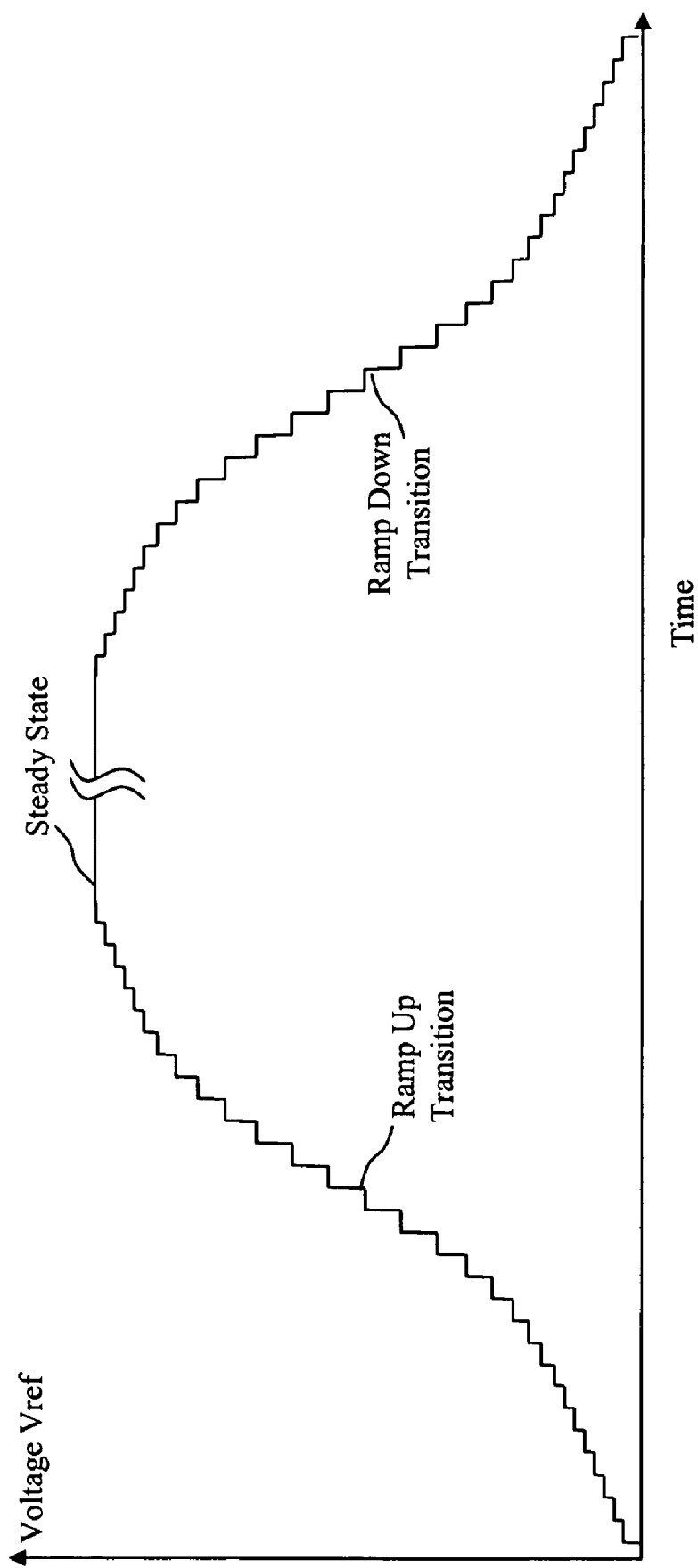
FIG. 2 illustrates a time dependent pre-defined voltage characteristic response used by the circuit of FIG. 1.

As illustrated in FIG. 2, the voltage reference providing circuitry 140 provides a time dependent pre-defined voltage characteristic response at the voltage reference output 141 that supplies a time varying ramp up transition reference voltage in discrete stepped increments during a transition from zero volts to a steady state condition. In other words, the voltage reference providing circuitry 140 provides a shaped voltage Vref and if the steps of the time varying transition reference voltage to the second input 152 of the integrator 150 without a need for what is know in the art as a steady state holding voltage prior to the transition to the steady state condition (final maximum reference value). Also, if the and if the steps of the time varying transition reference voltage are less than 64 steps, the RC smoothing circuit of resistor R8 and capacitor C3 achieves an acceptable transient response for adjacent channel power transients. Furthermore, the shape of the ramp up transition is substantially sinusoidal and there is also a substantially sinusoidal ramp down transition for removal of the voltage Vref as described later.

Figure 3:
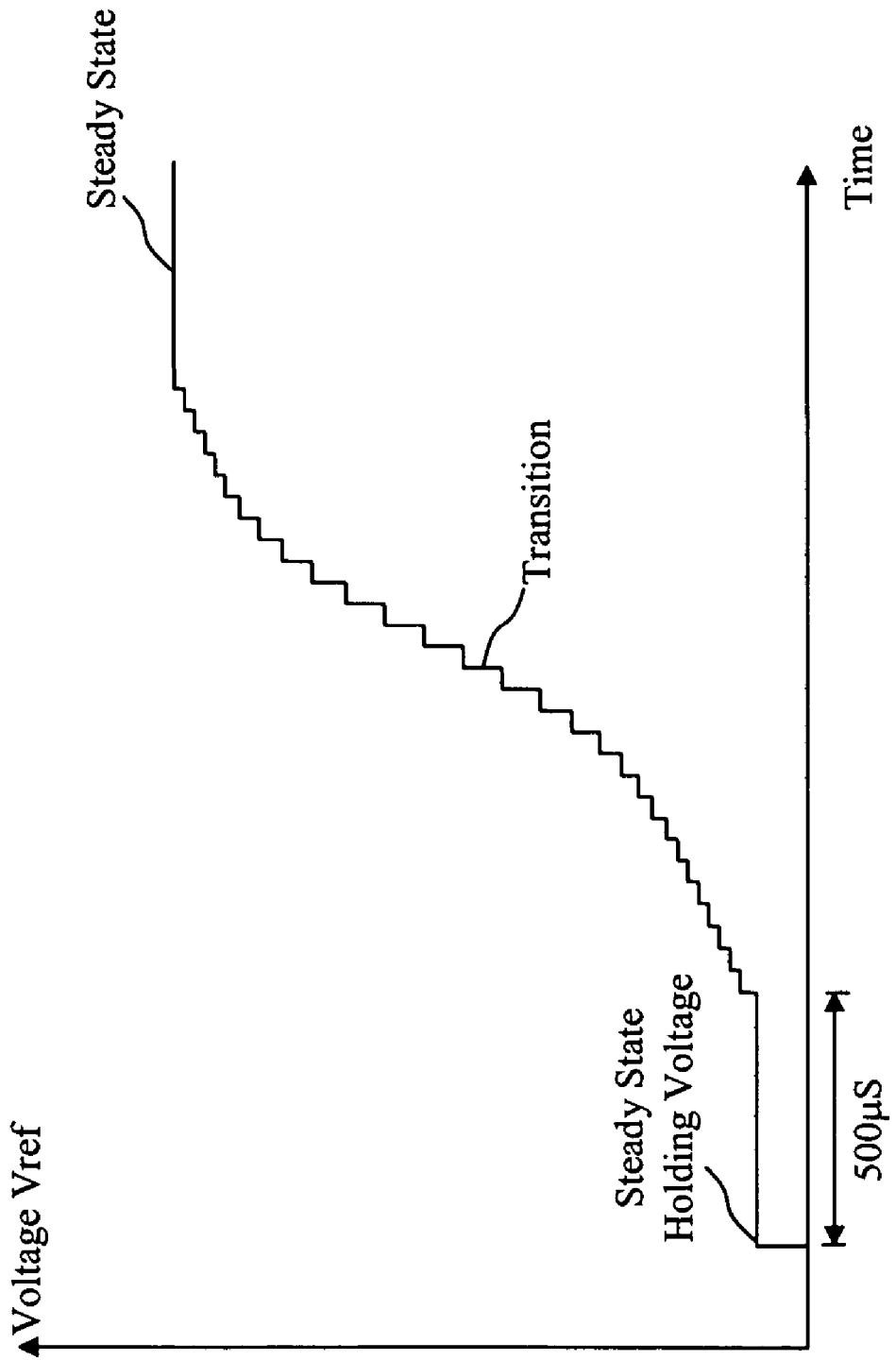
FIG. 3 illustrates a typical prior art time dependent pre-defined voltage characteristic response.

The shape of the ramp up transition results in a substantially co-sinusoidal integrated voltage difference output control signal at the integrated output 153 during the transition to the steady state condition of the pre-defined voltage characteristic response at the voltage reference output 141. In contrast, commonly used amplifier and associated power control circuits typically use an output time dependent response as illustrated in FIG. 3. This response of FIG. 3 has as a steady state holding voltage before transitioning to a final steady state voltage. This holding voltage is typically 500 μSeconds and is required in known amplifiers and associated power control circuit in order to meet ETS splatter requirements. In addition, typical known amplifier and associated power control circuits that use the voltage characteristic of FIG. 3 require a relatively complicated Log Amplifier, couplers and transmission line processing circuitry.

Figure 4:
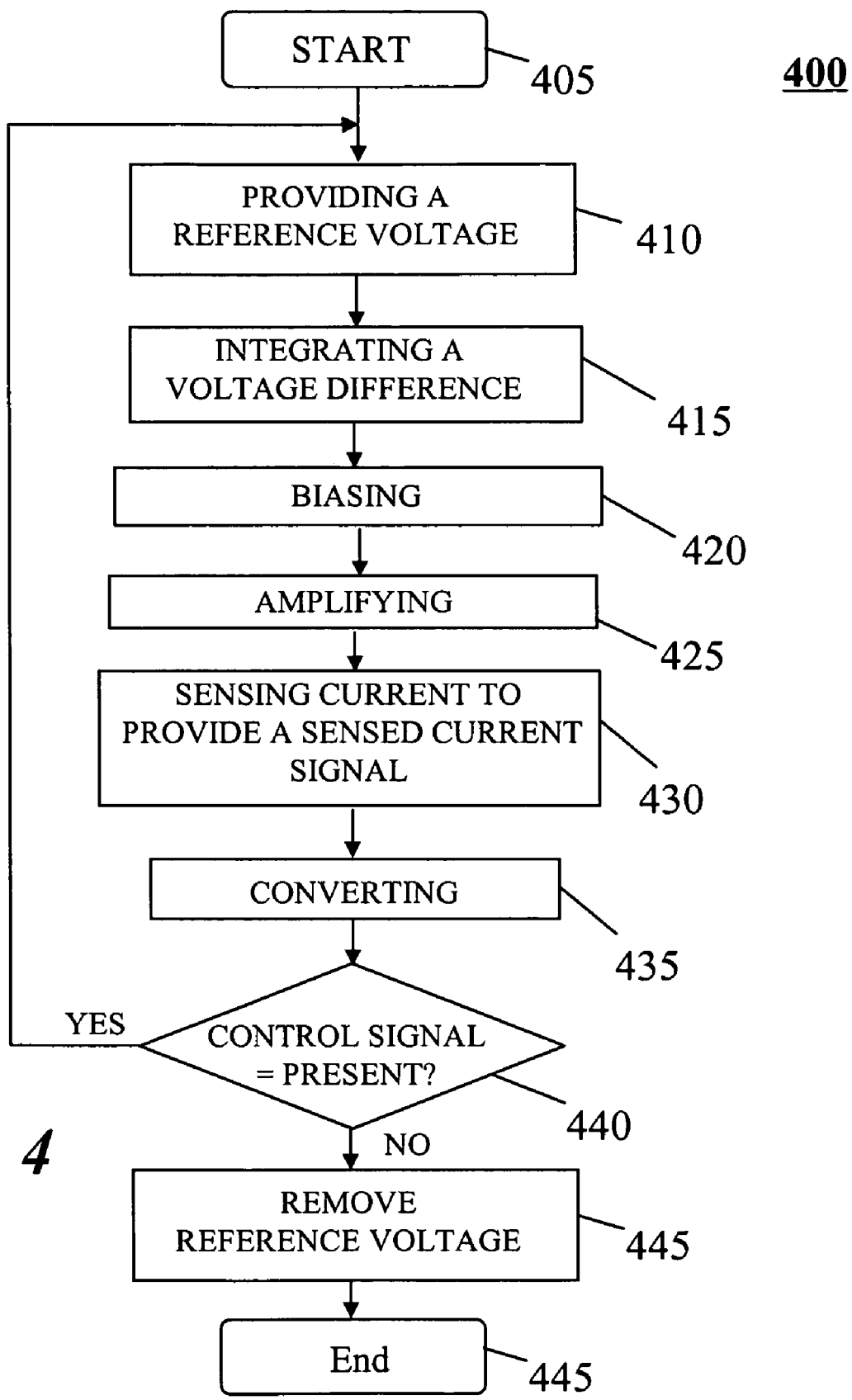
FIG. 4 illustrates modified ramped reference voltages provided by the automatic voltage level control circuit of FIG. 1.

Referring to FIG. 4 there is illustrated a method 400 for controlling power provided at an output of the power amplifier 110, the method 400 being performed by the power amplifier and associated power control circuit 100. The method 400 is invoked, a start block 405, when the PTT trigger circuit 180 receives a transmit request TXR from a user of a radio communications device within which the power amplifier and associated power control circuit 100 resides. Hence, the transmit request TXR instructs the trigger circuit 180 to provide the transmit request control signal to control inputs 193 and 143. Next, at a block 410, the method 400 performs providing a voltage reference at output 141 in response to a transmit request control signal provided at input 143. The voltage reference Vref is the time dependent pre-defined voltage characteristic of FIG. 2. Also, in response to transmit request control signal provided at input 193, the switching circuit 190 will provide the supply voltage to operational amplifier1 OA1 and operational amplifier2 OA2.

The integrator 150 then performs, at a block 415, integrating a voltage difference between the voltage reference Vref and a voltage detection value VDet, the voltage detection value VDet being dependent upon the power provided at an output of the power amplifier 100. The integrating provides, at the integrator output 153, an integrated voltage difference output control signal.

The direct current biasing circuit 195 eliminates any radio frequency signals from being supplied to the integrator output 153 whilst slightly attenuating the integrated voltage difference output control signal to provide a direct current bias voltage. Thus, at a block 420, there is performed biasing the power amplifier 10 with the direct current bias voltage, the value of which is dependent on the integrated voltage difference output control signal. Accordingly, if this direct current bias voltage is above a threshold voltage then, at a block 425, the power amplifier 110 provides for amplifying a radio frequency signal supplied at an input to the power amplifier, from the Voltage Controlled Oscillator 160, wherein the amplifying is dependent on a value of the direct current bias voltage. Furthermore, the direct current bias voltage provides for biasing the power amplifier from a substantially non-amplifying state to a desired amplifying state, where the direct current bias voltage controls power supplied to the power amplifier by the supply voltage line Vcc. Also, the amplifying provides an amplified radio frequency signal at the amplifier output 112 that is transmitted by an antenna coupled to the amplifier output 112.

The current sensing resistor Rsen, at a block 430, provides for sensing current drawn by the power amplifier to provide a sensed current signal and the current to voltage converter 120 performs, at a block 435, converting the sensed current signal into the voltage detection value. As will be apparent to a person skilled in the art, this voltage detection value varies in response to variations in the sensed current signal.

As long as the trigger circuit provides the transmit request control signal, as determined at a test block 440, blocks 410 to 435 are repeated. However, when the PTT trigger circuit 180 stops receiving the transmit request TXR then the transmit request control signal is no longer present, the voltage reference Vref at output 141 is applied with the signal of FIG. 2 in the reverse order to ramp down to zero volts as indicated by a ramp down transistion performed at a block 445. The supply voltages to operational amplifier1 OA1 and operational amplifier2 OA2 are also removed at block 445. The method 400 then terminates an end block 450.

As will be apparent to a person skilled in the art, at block 410, the provided reference voltage Vref at output 141 is initially a time varying transition reference voltage in discrete stepped increments. Thus, initially each time the method 400 proceeds to perform block 410, the value of the reference voltage Vref has increased in value by one discrete stepped increment during the transition from transition from zero volts to the steady state condition that is typically 1.5 volts. The time dependent pre-defined voltage characteristic Vfef has only a single steady state condition during the transition of the power amplifier 110. In other words Vref is devoid of a steady state holding voltage during the transition of the power amplifier and Vref comprises a discrete non linear substantially sinusoidal transition followed by the single steady state condition.

When steady state condition is achieved the circuit 100 can compensate for variations in the supply voltage line Vcc and temperature variations to maintain a bias to the power amplifier 110 that provides a desired gain thereof.

Advantageously, the present invention does not require a holding voltage before transition to the steady state condition, as can be seen by the pre-defined voltage characteristic of FIG. 2, nor does the invention require log amplifier, couplers and transmission line processing circuitry in order to control the power amplifier 110. Furthermore, the present invention allows for the reference voltage Vref at output 141 during the transition to be substantially sinusoidal. This consequently results in a substantially co-sinusoidal integrated voltage difference output control signal at the integrated output 153 during the transition to the steady state condition of the pre-defined voltage characteristic response at the voltage reference output 141. This is essentially why no holding voltage and no log amplifier is required in order to meet ETS splatter requirements. However, it should be noted that other shaped responses for the reference voltage Vref at output 141 during the transition are possible such as a Gaussian transient response.

The above detailed description provides an exemplary embodiment only, and is not intended to limit the scope, applicability, or configuration of the present invention. Rather, the detailed description of the exemplary embodiment provides those skilled in the art with an enabling description for implementing the exemplary embodiment of the invention. It should be understood that various changes can be made in the function and arrangement of elements and steps without departing from the spirit and scope of the invention as set forth in the appended claims.

We claim:

1. An amplifier and associated power control circuit comprising:
   a power amplifier coupled through a current sensing resistor to a supply voltage line, the power amplifier having an amplifier input and an amplifier output;
   a current to voltage converter having a converter output and at least one converter input, the converter input being coupled to the supply voltage line of the power amplifier;
   a voltage reference providing circuitry having a voltage reference output, wherein, in use, the voltage reference providing circuitry provides a time dependent pre-defined voltage characteristic during a transition of the power amplifier from the non-amplifying state to the amplifying state;
   an integrator having an integrator output, a first input coupled to the converter output and a second input coupled to the voltage reference output; and
   a direct current biasing circuit coupling the integrator output to the amplifier input.

2. An amplifier and associated power control circuit as claimed in claim 1, wherein, in use, a potential difference occurring between the first input and second input is integrated by the integrator to provide an integrated voltage difference output control signal at the integrator output, and wherein the output control signal controls power supplied to the power amplifier by the supply voltage line.

3. An amplifier and associated power control circuit as claimed in claim 1, wherein, in use, the output control signal provides for biasing the power amplifier from a substantially non-amplifying state to a desired amplifying state.

4. An amplifier and associated power control circuit as claimed in claim 1, wherein the time dependent pre-defined voltage characteristic is characterized by having only a single steady state condition during the transition of the power amplifier.

5. An amplifier and associated power control circuit as claimed in claim 4, wherein the time dependent pre-defined voltage characteristic is characterized by comprising a discrete non linear transition followed by the single steady state condition.

6. An amplifier and associated power control circuit as claimed in claim 1, wherein the transition is substantially sinusoidal.

7. An amplifier and associated power control circuit as claimed in claim 1, wherein the transition is substantially Gaussian.

8. An amplifier and associated power control circuit as claimed in claim 1, wherein there is an oscillator coupled to the amplifier input.

9. An amplifier and associated power control circuit as claimed in claim 1, wherein there is a trigger circuit for controlling power supplied to the integrator.

10. An amplifier and associated power control circuit as claimed in claim 9, wherein the trigger circuit, in use, provides a control signal for activation of the voltage reference providing circuitry.

11. An amplifier and associated power control circuit as claimed in claim 10, wherein the trigger circuit controls power supplied to the current to voltage converter to effect the transition of the power amplifier.

12. An amplifier and associated power control circuit as claimed in claim 10, wherein the trigger circuit controls power supplied to the power amplifier.

13. A method for controlling power provided at an output of the power amplifier, the method including:
   Providing a voltage reference in response to a transmit request control signal, the voltage reference being a time dependent pre-defined voltage characteristic during a transition of the power amplifier from the non-amplifying state to the amplifying state;
   Integrating a voltage difference between the voltage reference and a voltage detection value, the voltage detection value being dependent upon the power provided at an output of the power amplifier, the integrating providing an integrated voltage difference output control signal;
   Biasing the power amplifier with a direct current bias voltage the value of which is dependent on the integrated voltage difference output control signal;
   Amplifying a radio frequency signal supplied at an input to the power amplifier, the amplifying being dependent on a value the direct current bias voltage;
   Sensing current drawn by the power amplifier to provide a sensed current signal; and
   Converting the sensed current signal into the voltage detection value, the voltage detection value varying in response to variations in the sensed current signal.

14. A method for controlling power provided at an output of the power amplifier as claimed in claim 13, wherein the direct current bias voltage controls power supplied to the power amplifier by the supply voltage line.

15. A method for controlling power provided at an output of the power amplifier as claimed in claim 13, wherein the direct current bias voltage provides for biasing the power amplifier from a substantially non-amplifying state to a desired amplifying state.

16. A method for controlling power provided at an output of the power amplifier as claimed in claim 13, wherein the time dependent pre-defined voltage characteristic is characterized by having only a single steady state condition during the transition of the power amplifier.

17. A method for controlling power provided at an output of the power amplifier as claimed in claim 16, wherein the time dependent pre-defined voltage characteristic may also be characterized by being devoid of a steady state holding voltage during the transition of the power amplifier.

18. A method for controlling power provided at an output of the power amplifier as claimed in claim 17, wherein the time dependent pre-defined voltage characteristic is characterized by comprising a discrete non linear transition followed by the single steady state condition.

19. A method for controlling power provided at an output of the power amplifier as claimed in claim 18 wherein the transition is substantially sinusoidal.

20. A method for controlling power provided at an output of the power amplifier as claimed in claim 18 wherein the transition is substantially Gaussian.

* * * * *